(12) United States Patent
Shichijo

(10) Patent No.: US 10,279,728 B2
(45) Date of Patent: May 7, 2019

(54) LIGHT-EMITTING DEVICE

(71) Applicant: NICHIA CORPORATION, Anan-shi, Tokushima (JP)

(72) Inventor: Satoshi Shichijo, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/662,702

(22) Filed: Jul. 28, 2017

(65) Prior Publication Data
US 2018/0029523 A1    Feb. 1, 2018

(30) Foreign Application Priority Data

Aug. 1, 2016 (JP) ................................. 2016-151344

(51) Int. Cl.
| | |
|---|---|
| *B60Q 1/04* | (2006.01) |
| *F21S 45/10* | (2018.01) |
| *H01L 33/60* | (2010.01) |
| *H01L 33/50* | (2010.01) |
| *F21S 43/14* | (2018.01) |
| *F21S 41/64* | (2018.01) |
| *F21S 41/141* | (2018.01) |

(52) U.S. Cl.
CPC ................ *B60Q 1/04* (2013.01); *F21S 45/10* (2018.01); *H01L 33/504* (2013.01); *H01L 33/508* (2013.01); *H01L 33/60* (2013.01); *F21S 41/141* (2018.01); *F21S 41/64* (2018.01); *F21S 43/14* (2018.01); *H01L 33/505* (2013.01)

(58) Field of Classification Search
USPC .................................................. 362/615–618
See application file for complete search history.

(56) References Cited

U.S. PATENT DOCUMENTS

| | | |
|---|---|---|
| 2010/0264438 A1 | 10/2010 | Suenaga |
| 2013/0026527 A1 | 1/2013 | Ichikawa |
| 2013/0056781 A1 | 3/2013 | Suenaga |

(Continued)

FOREIGN PATENT DOCUMENTS

| | | |
|---|---|---|
| JP | 2010-192629 A | 9/2010 |
| JP | 2010-219324 A | 9/2010 |

(Continued)

*Primary Examiner* — Matthew Mikels
(74) *Attorney, Agent, or Firm* — Global IP Counselors, LLP

(57) ABSTRACT

A light emitting device includes a light emitting element, a first light transmissive member, a second light transmissive member, and a light reflective member. The first light transmissive member contains a first phosphor. The first light transmissive member is in contact with an upper surface of the light emitting element, and has an area smaller than the light emitting element in a plan view. The second light transmissive member contains a second phosphor. The second light transmissive member covers lateral surfaces of the first light transmissive member and a part of the upper surface of the light emitting element that is exposed from the first light transmissive member, with an upper surface of the first light transmissive member being not covered by the second light transmissive member. The light reflective member covers lateral surfaces of the second light transmissive member and lateral surfaces of the light emitting element.

13 Claims, 6 Drawing Sheets

(56) References Cited

U.S. PATENT DOCUMENTS

| | | | |
|---|---|---|---|
| 2013/0193458 A1 | 8/2013 | Mochizuki | |
| 2013/0313602 A1 | 11/2013 | Suenaga | |
| 2014/0322844 A1 | 10/2014 | Ichikawa et al. | |
| 2015/0048398 A1 | 2/2015 | Ichikawa et al. | |
| 2015/0076548 A1 | 3/2015 | Ichikawa | |
| 2015/0118771 A1 | 4/2015 | Ichikawa | |
| 2016/0049560 A1* | 2/2016 | Oh | H01L 33/504 257/98 |
| 2016/0155912 A1 | 6/2016 | Burger et al. | |

FOREIGN PATENT DOCUMENTS

| | | |
|---|---|---|
| JP | 2010-238846 A | 10/2010 |
| JP | 2010-272847 A | 12/2010 |
| JP | 2010-283281 A | 12/2010 |
| JP | 2013-110199 A | 6/2013 |
| JP | 2013-153094 A | 8/2013 |
| JP | 2014-232866 A | 12/2014 |
| JP | 2015-029079 A | 2/2015 |
| WO | 2011-126000 A1 | 10/2011 |

* cited by examiner

F I G. 2 B
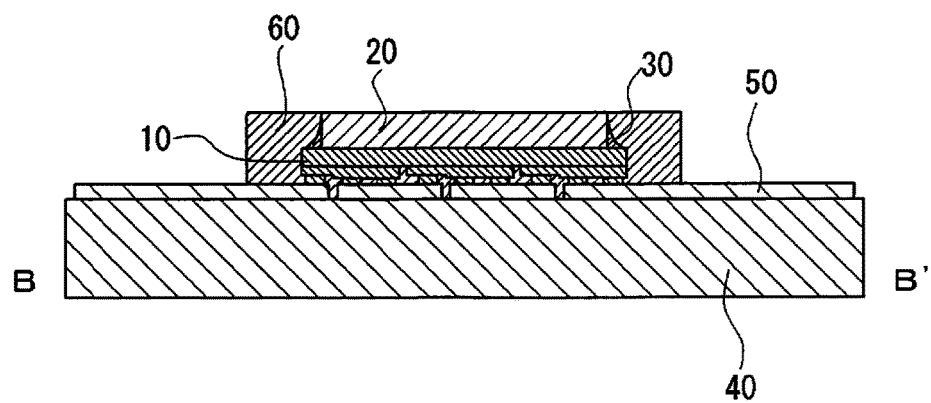

LIGHT-EMITTING DEVICE

CROSS-REFERENCE TO RELATED APPLICATION

This application claims priority to Japanese Patent Application No. 2016-151344, filed on Aug. 1, 2016, the disclosure of which is hereby incorporated by reference in its entirety.

BACKGROUND

The present disclosure relates to a light emitting device.

Light emitting elements are used as high luminance light sources for, not only for lighting replacing a fluorescent light, but also for example, automotive headlights and other such light projectors, floodlight, and so forth that require high directionality and high luminance.

For example, a Japanese Patent Publication No. 2010-272847 discloses a light emitting device in which lateral surfaces of a light transmissive member adhering to and covering a light emitting element outwardly inclines toward a lower surface of the light transmissive member. The inclined lateral surfaces and a portion of the lower surface that is not in contact with the light emitting element are covered by a light reflective member, in order to realize high luminance.

SUMMARY

Light emitting devices used for vehicle component require a light sources having even higher luminance.

A light emitting device includes a light emitting element, a first light transmissive member, a second light transmissive member, and a light reflective member. The first light transmissive member contains a first phosphor. The first light transmissive member is in contact with an upper surface of the light emitting element, and has an area smaller than the light emitting element in a plan view. The second light transmissive member contains a second phosphor. The second light transmissive member covers lateral surfaces of the first light transmissive member and a part of the upper surface of the light emitting element that is exposed from the first light transmissive member, with an upper surface of the first light transmissive member being not covered by the second light transmissive member. The light reflective member covers lateral surfaces of the second light transmissive member and lateral surfaces of the light emitting element.

With the certain embodiment disclosed herein, a high-luminance light emitting device can be produced.

BRIEF DESCRIPTION OF DRAWINGS

A more complete appreciation of the disclosure and many of the attendant advantages thereof will be readily obtained as the same becomes better understood by reference to the following detailed description when considered in connection with the accompanying drawings.

FIG. 2B is a schematic cross-sectional view taken along lines B-B' in FIG. 2A.

DESCRIPTION

There is a case where a magnitude or positional relation of members illustrated in each drawing is exaggerated so as to clarify the description. In the description below, the same term or reference number represents the same or homogenous member in principle, and its detailed description will be omitted as appropriate. The description given in certain examples and embodiments are applicable to the other examples and embodiments.

First Embodiment

Figure 1A:
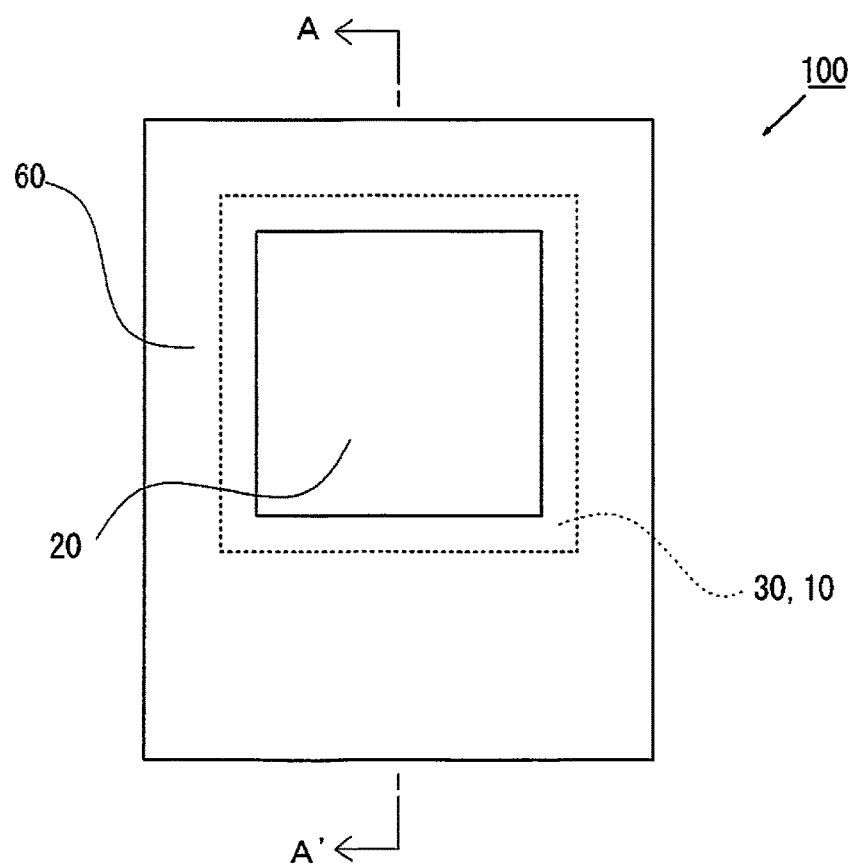
FIG. 1A is a schematic plan view showing a light emitting device of a first embodiment according to the present disclosure.
Figure 1B:
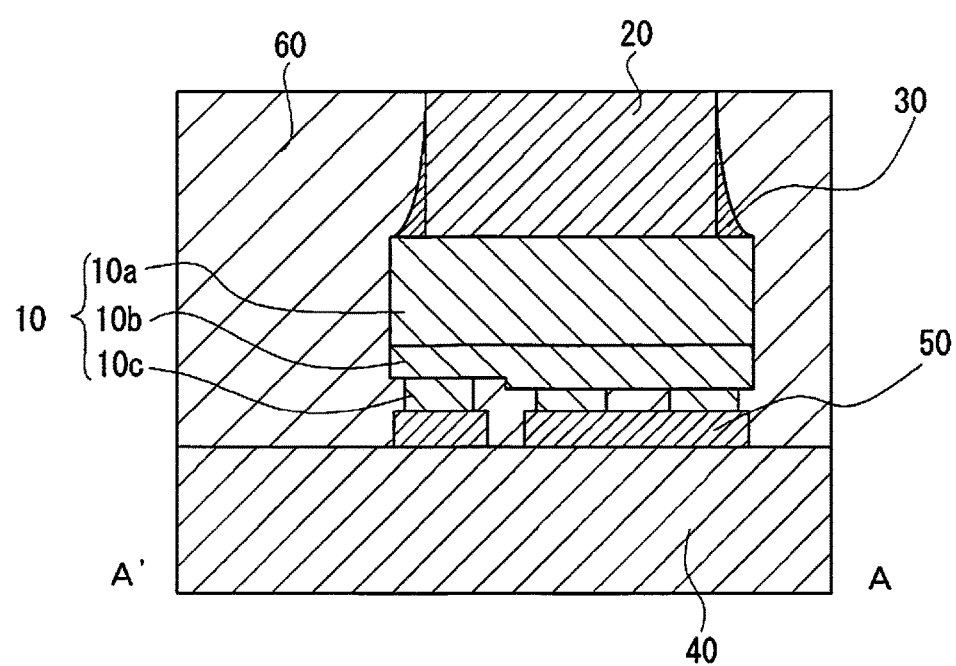
FIG. 1B is a schematic cross-sectional view taken along lines A-A' in FIG. 1A.
Figure 1C:
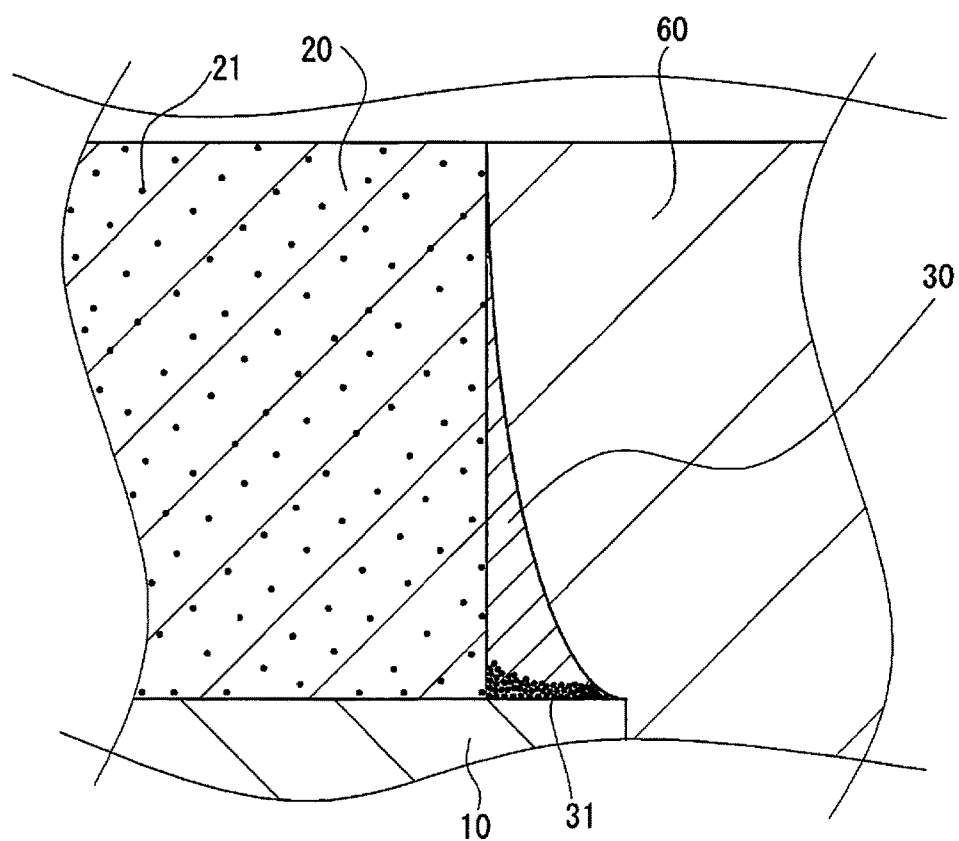
FIG. 1C is a schematic cross-sectional view showing a periphery of a second light transmissive member of the first embodiment.

A light emitting device 100 according to the present disclosure includes a light emitting element 10, a first light transmissive member 20, a second light transmissive member 30, and a light reflective member 60 as shown in FIG. 1A to FIG. 1C. The first light transmissive member 20 is in contact with an upper surface of the light emitting element 10, has an area smaller than the light emitting element 10 in a plan view, and contains a first phosphor 21. The second light transmissive member 30 exposes an upper surface of the first light transmissive member 20, covers lateral surfaces of the first light transmissive member 20 and a part of the upper surface of the light emitting element 10 that is exposed from the first light transmissive member 20, and contains a second phosphor 31. The light reflective member 60 covers lateral surfaces of the second light transmissive member 30 and lateral surfaces of the light emitting element 10.

The elements and members are described in detail below.

Light Emitting Element 10

For the light emitting element 10, a semiconductor light emitting element such as light emitting diode can be used. The light emitting element 10 having an appropriate wavelength can be selected. The light emitting element 10 can include a light transmissive substrate 10a, a semiconductor layered body 10b formed on the light transmissive substrate 10a, and a set of positive and negative electrodes 10c provided on a surface of the semiconductor layered body 10b. The number of the light emitting element 10 included in a light emitting device can be one or more. The light emitting element 10 may has a structure of a single semiconductor layered body 10b provided on a single light transmissive substrate 10a, or a structure of a plurality of semiconductor layered bodies 10b provided on the single transmissive substrate 10a.

The semiconductor layered body 10b provided in the light emitting element 10 is a multilayered semiconductor body. As an example, a semiconductor layered body can include three semiconductor layers configured with a first conductive semiconductor layer (i.e., n-type semiconductor layer), a light emitting layer (i.e., active layer), and a second conductive semiconductor layer (i.e., p-type semiconductor layer). In case of a semiconductor layer capable of emitting ultraviolet light or visible light in a range of blue light to green light, a semiconductor layer can be formed of a semiconductor material such as a Group III-V compound semiconductor material and a Group II-VI compound semiconductor material, for example. Specifically, nitride-based semiconductor material such as $In_XAl_YGa_{1-X-Y}N$ ($0 \leq X$, $0 \leq Y$, $X+Y \leq 1$) can be used.

For the light transmissive substrate 10a in the light emitting element 10, in the case of nitride semiconductor materials as mentioned above, a insulating material having light transmission such as sapphire ($Al_2O_3$) or spinel ($MgAl_2O_4$), or semiconductor materials transmitting light from a semiconductor layered body (e.g., nitride semiconductor material) can be used. The term "light transmission" may refer to a property capable of transmitting 60% or more, preferably 80% or more of light emitted from a light emitting element.

The set of electrodes 10c of light emitting element 10 are disposed on one surface of the semiconductor layered body 10b (i.e., the opposite surface of the light transmissive substrate 10a). In the light emitting element 10, the surface, on which the set of electrodes 10c are formed, is defined as a lower surface thereof, and an upper surface opposite the lower surface is defined as a light extraction surface (i.e., a surface of the light transmissive substrate 10a). Each of the electrodes 10c may have a single layer structure or multi-layer structure as long as the above-mentioned first conductive semiconductor layer and second conductive semiconductor layer are respectively connected to the corresponding electrodes 10c to make ohmic connection that provides linear or almost linear current-voltage characteristic. Such electrodes may employ a material and structure that are known in the art, and may be formed in a desired thickness. Examples of suitable electrodes include metal such as Cu, Au, AuSn.

First Transmissive Member 20

The first transmissive member 20 is disposed on the upper surface of the light emitting element 10, and capable of transmitting and outputting light emitted from the light emitting element 10. The first transmissive member 20 contains a first phosphor 21. The light transmissive member 20 includes an upper surface, a lower surface opposite the upper surface, lateral surfaces positioned between the upper surface and the lower surface. The upper surface is a light emitting surface of the light emitting device 100 serving as a surface outputting light from the light emitting element 10, and the lower surface is a surface covering the light emitting surface of the light emitting element 10.

Preferably, the upper surface and the lower surface of the first light transmissive member 20 are both substantially flat surfaces and substantially parallel to each other. The term "substantially parallel" in the present specification may have ±5% of tolerance of inclination with respect to one surface to the other surface. Such shape allows the light emitting device 100 to have uniform front luminance and less color non-uniformity on the upper surface of the light transmissive member 20 serving as the light emitting surface. The light transmissive member 20 has a thickness (i.e., a height from the lower surface and the upper surface), for example, 50 μm to 300 μm.

The first transmissive member 20 has an area smaller than that of the light emitting element 10. In a plane view of the light emitting device 100, an outer edge of the light transmissive member 20 is positioned inside an outer edge of the light emitting element 10. Accordingly, with the upper surface of the light transmissive member 20 serving as the light emitting surface of the light emitting device 100, the light emitting device 100 with high front luminance can be produced by narrowing the light emitting surface.

The lateral surfaces of the first light transmissive member 20 are preferably substantially flat, and substantially perpendicular to the upper surface of the first transmissive member 20. Accordingly, with the upper surface of the light transmissive member 20 serving as the light emitting surface of the light emitting device 100, a border is clearly defined between the upper surface of the first light transmissive member 20 serving as a light emission part of the light emitting device 100 and a light reflective member 60 (described below) surrounding the upper surface of the first light transmissive member 20, thereby enabling realization of the light emitting device 100 in which a border is clearly defined between the light emission part and a non-light emission part. The term "substantially perpendicular" in the present specification refers that an angle defined by one surface and the other surface is approximately 90°±5°.

In the present embodiment, the first transmissive member 20 contains the first phosphor 21 capable of converting wavelength of at least a part of light emitted from the light emitting element 10. By containing the first phosphor 21 in the first light transmissive member 20, light extracted to outside from the upper surface of the first light transmissive member 20 is a mixture of light emitted from the light emitting element 10 and light experiencing wavelength conversion by the first phosphor 21. Thus, by mixing blue light emitted from the light emitting element 10 and yellow light emitted from the first phosphor 21 resulting from wavelength conversion of a part of the blue light, the light emitting device 100 emitting white-color-based light can be obtained. Examples of the first light transmissive member 20 containing the first phosphor 21 include phosphor sintered body, and materials made of resins, glass, or other inorganic materials which contain a phosphor powder.

For the phosphor 21 contained in the first light transmissive member 20, a phosphor excitable by light emitted from the light emitting element 10 can be used. For example, one of the specific examples listed below can be used alone, or two or more thereof can be used in combination. Examples of phosphors excitable by light emitted from a blue light emitting element or an ultraviolet light emitting element include: cerium-activated yttrium aluminum garnet-based phosphors (e.g., $Y_3(Al,Ga)_5O_{12}$:Ce); cerium-activated lutetium aluminum garnet-based phosphors (e.g., $Lu_3(Al,Ga)_5O_{12}$:Ce); europium- and/or chromium-activated nitrogen-containing calcium aluminosilicate-based phosphors (e.g., $CaO-Al_2O_3-SiO_2$:Eu); europium-activated silicate-based phosphors (e.g., $(Sr,Ba)_2SiO_4$:Eu); nitride-based phosphors, such as β-SiAlON phosphors (e.g., $Si_{6-z}Al_zO_zN_{8-z}$:Eu ($0<Z<4.2$)), CASN-based phosphors (e.g., $CaAlSiN_3$:Eu), and SCASN-based phosphors (e.g., $(Sr,Ca)AlSiN_3$:Eu); manganese-activated potassium fluorosilicate-based phosphors (e.g., $K_2SiF_6$:Mn); sulfide-based phosphors; and quantum dot phosphors. By combining one or more phosphors with a blue or ultraviolet light emitting element, desired emission color of light emitting devices (e.g., a white light emitting device) can be produced. In the case of a white light emitting device, types and concentrations of the one or more phosphors contained in the first light transmissive member 20 are adjusted to generate white light. In the case where such one or more phosphors are contained in the first light transmissive member 20, concentrations of the phosphors are preferably, for example, 5 mass % to 50 mass %.

The first light transmissive member 20 can contain one or more light diffusion materials in addition to the phosphors.

Examples of the light diffusion material capable of being contained in the first light transmissive member 20 include titanium oxide, barium titanate, aluminum oxide, silicon oxide, or the like.

Joining of First Light Transmissive Member and Light Emitting Element

Preferably, the light emitting element 10 and the first light transmissive member 20 are directly joined together without using a joining material such as an adhesive agent. The term "directly join" as used herein refers to joining an interface to be joined (i.e., an upper surface of the light emitting element 10 and the lower surface of the first light transmissive member 20) using atomic bonding, but not using a joining material such as an adhesive agent.

By directly joining the first light transmissive member 20 and the light emitting element 10, heat dissipation of the first light transmissive member 20 can be increased, thereby enhancing reliability of the light emitting device 100. Specifically, the first light transmissive member 20 contains one or more phosphors, and heat generated by phosphors can be efficiently dissipated through the light emitting element 10.

Methods of the direct joining suitable for the present embodiment can be, for example, surface activated joining, atomic diffusion joining, hydroxyl group joining, or the like. The surface activated joining is performed by irradiating an interface with inactive ion in an ultrahigh vacuum environment in order to clean and activate surfaces to be joined (See International Patent Publication No. 2011/126000). The atomic diffusion joining is performed by sputtering a metal in an ultrahigh vacuum environment to join surfaces with metal diffusion. It is confirmed that the joining can be performed without affecting light extraction by making the sputtered film sufficiently thin (See Japanese Patent Publication No. 2015-29079). In the case of atomic diffusion joining, the light emitting element 10 and the first light transmissive member 20 are joined interposing a sufficiently thin metal film that does not substantially affect light extraction. In the present disclosure, however, atomic diffusion joining is regarded that the light emitting element 10 and the first light transmissive member 20 are directly in contact with each other. In the case of hydroxyl group joining, hydroxyl groups are formed on an interface to be joined, and the light emitting element 10 and the first light transmissive member 20 are joined together by hydrogen bonding using hydroxyl groups (See Japanese Patent Publication No. 2014-232866). The above-mentioned three joining methods can be performed at room-temperature, however in some cases, heat treatment can be performed as necessary to enhance joining strength. In such cases, heat treatment can be performed at 400° C. or less, preferably at 300° C. or less, more preferably at 200° C. or less.

Second Light Transmissive Member 30

The second light transmissive member 30 exposes an upper surface of the first light transmissive member 20, while covering the lateral surfaces of the first light transmissive member 20, the part of the upper surface of the light emitting element 10 that are exposed on the first light transmissive member 20. The second light transmissive member 30 contains the second phosphor 31. In the upper surface of the light emitting element 10 serving as a joined surface with the first light transmissive member 20, the second light transmissive member 30 preferably covers the part of the upper surface of the light emitting element 10 that is exposed from the first light transmissive member 20. With this structure, light emitted from the part of the upper surface of the light emitting element 10 that is exposed from the first light transmissive member 20 is incident on the second light transmissive member 30 containing the second phosphor 31, then is converted the wavelength by the second phosphor 31.

The second light transmissive member 30 covers at least one portion of the lateral surfaces of the first light transmissive member 20. For example, the lateral surfaces of the first light transmissive member 20 may be entirely covered by the second light transmissive member 30, or may each have a portion that is partially exposed from (not covered by) the second light transmissive member 30 at the upper surface side. In this case, the greatest length of an portion of the lateral surfaces of the first light transmissive member 20 exposed from the second light transmissive member 30 is about ⅕ or less than the height of the first light transmissive member 20 (i.e., a distance between the upper surface and the lower surface of the first light transmissive member 20). When the second light transmissive member 30 covers the first light transmissive member 20 up to an edge of its upper surface, a width of the second light transmissive member 30 is preferably thin at the above-mentioned portion of the first light transmissive member 20 covered by the second light transmissive member 30, in a cross-sectional view. Specifically, the width of the second light transmissive member 30 covering the above-mentioned portion of the first light transmissive member 20 is preferably 10 μm or less, in a cross-sectional view. This structure can discourage light from directly exiting from the second light transmissive member 30. Accordingly, a luminance difference is clearly defined between the upper surface of the first light transmissive member 20 serving as the light emission part of the light emitting device 100 and the peripheral edge of the light emission part serving as a non-light emission part (i.e., an upper surface of the light reflective member 60 surrounding the first light transmissive member 20), thereby enabling realization of the light emitting device 100 with clear difference of luminance and less color non-uniformity.

A cross-sectional shape of the second light transmissive member 30 may be a triangular defined by, for example, the upper surface of the light emitting element 10 exposed form the first light transmissive member 20 and one of the lateral surfaces of the first light transmissive member 20. A width of the second light transmissive member 30 that covers the lateral surfaces of the first light transmissive member 20 preferably differs depending on a position of the lateral surfaces of the first light transmissive member 20 in the height direction. Specifically, the width of the second light transmissive member 30 is preferably tapered toward the upper surface. More specifically, the second light transmissive member 30 has curved outer surfaces at a later-described light reflective member 60 side. This curved surfaces are preferably in contact with both of the lateral surfaces of the first light transmissive member 20 and an upper edge of the light emitting element 10, and preferably are concave to the light reflective member 60 side. Such a shape can form an appropriate light reflective surface by the light reflective member 60 extending along with the second light transmissive member 30. This can allow light emitted from the light emitting element 10 to be reflected by the light reflective surface of the light reflective member 60, therefore the reflected light can travel toward light emitting surface side of the light emitting device 100. This allows the light emitting device 100 to provide enhanced light extraction efficiency, even higher luminance, and higher luminous flux.

It is preferable that the second light transmissive member 30 continuously covers outer lateral surfaces of the first light transmissive member 20. In other words, it is preferable that the second light transmissive member 30 continuously covers the lateral surfaces of the first light transmissive member 20 and the part of the upper surface of the light emitting element 10 that is exposed from the first light transmissive member 20, in such a manner as to be along the outer periphery of the first light transmissive member 20. Accordingly, light emitted from the part of the upper surface of the light emitting element 10 that is exposed from the first light transmissive member 20 tends to be incident in the first light transmissive member 20 interposing the second light transmissive member 30, thereby enabling realization of the light emitting device 10 with high luminance and high luminous flux.

The second light transmissive member 30 is preferably formed of a material containing a resin for ease of handling and processing, and the resin material preferably contains the second phosphor 31. Examples of the resin material include one or more resins selected from the group consisting of silicone resins, modified silicone resins, epoxy resins, modified epoxy resins, acrylic resin, and fluorine resin, or hybrid resin thereof. The second light transmissive member 30 can be formed on the outer periphery of the first light transmissive member 20 and the upper surface of the light emitting element 10 by a known method such as printing, jetting, molding, potting, or the like, while the first light transmissive member 20 and the light emitting element 10 are joined together. Specifically, the potting method is preferable, because the curved surfaces of the second light transmissive member 30 can be readily formed in such a manner as to be concave to the later-described light reflective member 60 side.

The second phosphor 31 contained in the second light transmissive member 30 is preferably arranged on the lower side of the second light transmissive member 30. In other words, it is preferable that near the light emitting element 10 is, higher the density of particles of the second phosphor 31 contained in the second light transmissive member 30 becomes. Light from the light emitting element 10 is incident on the lower surface of the second light transmissive member 30. Therefore, arranging the particles of the second phosphor 31 more densely at the lower side of the light transmissive member 30 can discourage multiple light diffusion in the second light transmissive member 30, thereby enabling effective wavelength conversion. The above-mentioned structure allows heat generated at the phosphor particles to be effectively dissipated. When the second light transmissive member 30 is formed of a resin material containing the second phosphor 31, the second light transmissive member 30, in which the particles of the second phosphor 31 are densely arranged at the lower side thereof, can be readily formed by settling the particles of the second phosphor 31 in the resin member.

For the second phosphor 31 contained in the light transmissive member 30, a phosphor that can be excited by light emitted from the light emitting element 10. For example, the second phosphor 31 can employ a phosphor selected from the above-mentioned specific examples of the first phosphor 21.

A different type of phosphor or combination of phosphors can be used for the first phosphor 21 and the second phosphor 31, however, at least one phosphor contained in either the first phosphor 21 or the second phosphor 31 is preferably contained in the other one of those. When the same type of phosphor is contained in the first phosphor 21 and the second phosphor 31, it can be discouraged that color non-uniformity and chromaticity shift due to temperature change on the light emitting surface of the light emitting device 100.

Light Reflective Member 60

The light emitting device 100 includes a light reflective member 60 that surrounds light emitting element 10, the first light transmissive member 20, and the second light transmissive member 30. Specifically, the light transmissive member 60 is disposed in such a manner as to cover the lateral surfaces of the first light transmissive member 20 and the upper surface of the light emitting element 10 interposing the second light transmissive member 30. When the portion of each of the lateral surfaces of the first light transmissive member 20 are exposed from the second light transmissive member 30, the light reflective member 60 is disposed in such a manner as to directly cover the portion of each of the lateral surfaces of the first light transmissive member 20 that are exposed from the second light transmissive member 30. The lateral surfaces of the light emitting element 10 that are not covered by the second light transmissive member 30 are covered by the light reflective member 60. The upper surface of the first light transmissive member 20 is exposed from the light reflective member 60, serving as the light emitting surface of the light emitting device 100.

Figure 2A:
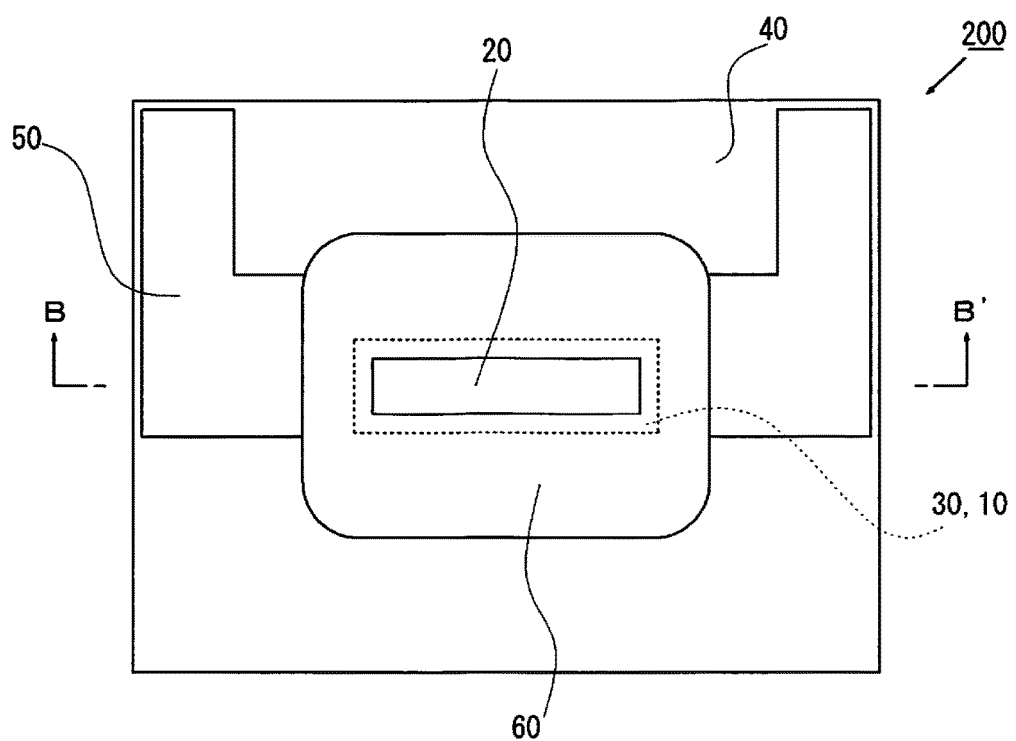
FIG. 2A is a schematic plan view showing a light emitting device of a second embodiment according to the present invention.
Figure 2C:
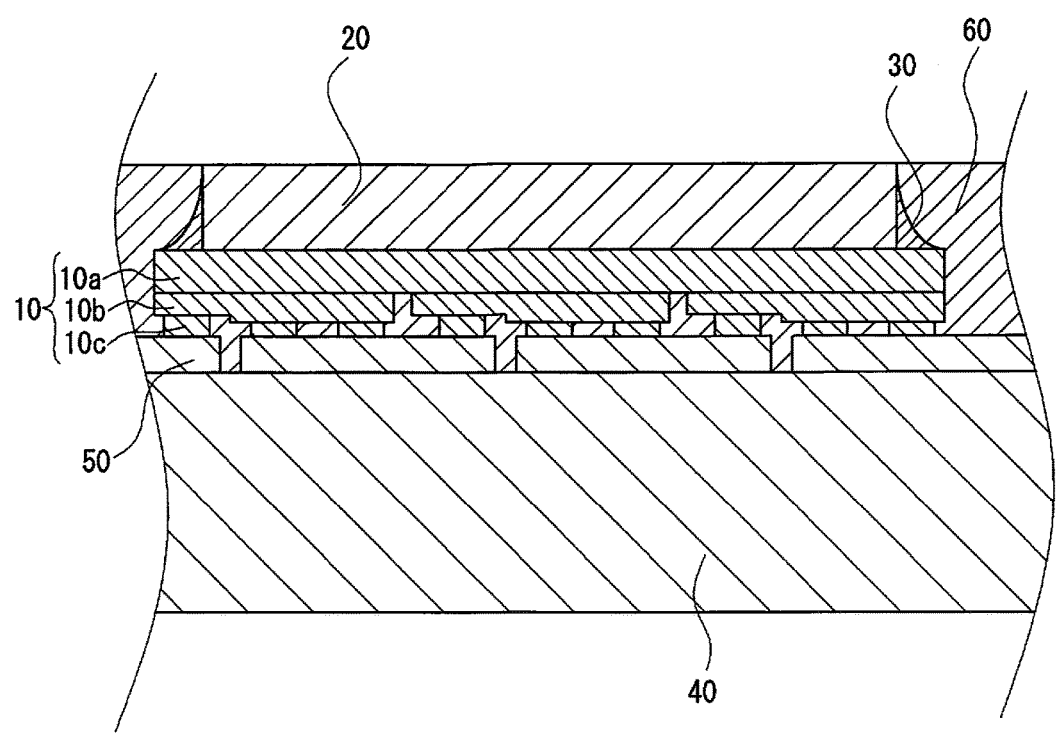
FIG. 2C is a schematic cross-sectional view showing a periphery of a light emitting element of the light emitting device according to the second embodiment.

When the light emitting element 10 is disposed on a mounting board 40, the light reflective member 60 is preferably disposed between the light emitting element 10 and the mounting board 40. When the light emitting element 10 includes a plurality of semiconductor layered bodies as shown in FIGS. 2B and 2C, the light reflective member 60 is preferably disposed between each of the plurality of semiconductor bodies. This is because light emitted by one of the multi-layer semiconductor bodies is less likely to be attenuated by traveling to an adjacent semiconductor body, thereby increasing the light extraction efficiency.

The light reflective member 60 can be formed of a material capable of reflecting light emitted from the light emitting element 10. Specifically, the light reflective member 60 can be formed by adding at least one light reflective substance to the same or similar resin material as that of the second light transmissive member 30. Examples of the light reflective substance include titanium oxide, silicon oxide, zirconium oxide, potassium titanate, alumina, aluminum nitride, boron nitride, mullite, or the like. The light reflective substance content in the light reflective member 60 is preferably, for example, in a range between 30 and 60 parts by weight with respect to 100 parts by weight of the resin as a base material, more preferably in a range between 45 and 60 parts by weight. This light reflective substance content is preferable because light leakage to outside of the light emitting device can be discouraged or prevented.

The light reflective member 60 can be formed by, for example, injection molding, potting, printing, transfer molding, compression molding, or the like.

The light emitting device 100 can incorporates a protection device, such as Zener diode. Embedding the protection device in the light reflective member 60 can prevent or discourage reductions in light extraction attributable to absorption or blocking of the light from the light emitting element 10 by the protection device.

As described above, the upper surface of the first light transmissive member 20 is determined as the light emitting surface of the light emitting device 100 by the light reflecting member 60 that exposes the upper surface of the first light transmissive member 20 having an area smaller than the light emitting element in a plane view, and covers the lateral surfaces continued from the upper surface. This can realize the light emitting device 100 with high front luminance by having a narrowed light emitting surface. High front luminance light emitting devices are especially suitable for vehicle lighting such as headlights. For vehicle lighting, emission colors of lighting or the like are specified by various standards. For example, the standards specify that light emitted from a headlight shall be white or yellow color, and shall be a single color as a whole.

In the present disclosure, high density of light exits from lateral side areas of the first light transmissive member 20 and an area on the upper surface of the light emitting element 10 exposed from the first light transmissive member 20 because light from the lateral surfaces of the first light transmissive member 20 and light from the upper surface of the light emitting element 10 are concentrated. Therefore, it is considered that the light reflective member 60 may be cracked or delaminated at the area where light from a plurality of directions is concentrated. When a crack or delamination is generated at the light reflective member 60 of a light emitting device in which the first light transmissive member 20 or the second light transmissive member 30 does not exist between the light reflective member 60 and the upper surface of the light emitting element 10, light emitted from the upper surface of the light emitting element 10 may leak from the light emitting surface of the light emitting device passing through the crack or delaminated part. For example, the light emitting device 100 emitting white light that is created by mixing blue light from the light emitting element 10 and yellow light having experienced wavelength conversion by portion of the blue light, may be used for a vehicle lighting application. In this case, if blue light emitted from the light emitting element 10 leaks besides the white light from the light emitting surface, such a device does not comply with the above-mentioned standards for vehicle lighting applications, as a result, a safety of the vehicle may be impaired.

In the present embodiment, however, the second light transmissive member 30 containing the second phosphor 31 covers the portion of the upper surface of the light emitting element 10 that is exposed from the first light transmissive member 20. Therefore, even when a crack is generated, light leaking from the crack would be mixed with light emitted from the first light emitting element 10 and wavelength converted light by the second phosphor 31, hence light other than the mixed light is less likely to leak from a portion at the light emitting surface side of the light emitting device 100. In the present embodiment, the second light transmissive member 30 covers portions around corners that the lateral surfaces of the first light transmissive member 20 are in contact with the upper surface of the light emitting element 10. Accordingly, light is less likely to be concentrated on the portions around corners, and therefore, the generation of crack can be reduced.

Mounting Board 40

In the light emitting device 100, the light emitting element 10 is mounted on the mounting board 40, as shown in FIG. 1A and FIG. 1B. Examples of materials used for the mounting board 40 include insulating materials such as glass epoxy, resins, and ceramics; and metal materials on which an insulating material is formed. Specifically, the mounting board is preferably formed of a ceramic material with highly heat resistant and highly environmental resistant. Examples of ceramic materials include alumina, aluminum nitride, and mullite. These ceramic materials can also be combined with an insulating material, such as BT resin, glass epoxy, and epoxy-based resin.

The mounting board 40 having a wiring pattern 50 formed thereon to be connected to the light emitting elements 10 is used. The wiring pattern 50 can be formed using a metal, for example, copper, aluminum, gold, silver, platinum, titanium, tungsten, palladium, iron, and nickel, or an alloy of these. The wiring pattern formed on the upper surface of the mounting board is preferably covered by a highly reflective material, such as silver or gold, in order for its uppermost surface to efficiently extract light from the light emitting elements 10. The wiring pattern 50 can be formed by electroplating, electroless plating, vapor deposition, sputtering, or the like. When Au bumps are used to mount a light emitting element on the mounting board, for example, using Au on the uppermost surface of the wiring pattern can improve the bonding between the light emitting element and the mounting board.

Such mounting board can be one known in the art, and any mounting board for use in mounting a light emitting element and the like can be used.

Second Embodiment

A light emitting device 200 according to the present disclosure is described as below. As shown in FIG. 2A to FIG. 2C, the light emitting device in the second embodiment, differs from the light emitting device 100 of the first embodiment in that a light emitting element 10 includes a plurality of semiconductor layered bodies disposed on a single light transmissive substrate 10a. The light emitting device in the second embodiment 200 can also be a high luminance light emitting device having a narrowed light emitting surface by considering an upper surface of a first light transmissive member 20 to be a light emitting surface of the light emitting device 200.

The light emitting device 200 with less non-uniformity in luminance or color can be produced because the plurality of semiconductor layered bodies are formed on the single light transmissive substrate. In FIG. 2C, the plurality of the semiconductor layered bodies 10b is disposed under the light transmissive substrate 10a.

Regions between the plurality of semiconductor layered bodies are subject to concentration of light from multiple directions, therefore, as mentioned above, it is considered that a crack or delamination tends to be generated on a light reflective member 60 disposed between the semiconductor layered bodies. In the preset embodiment, however, the plurality of semiconductor layered bodies 10b are provided on the single light transmissive substrate 10a. Hence, if a crack or delamination is occurred at the light reflective member positioned between the plurality of the semiconductor layered bodies, light other than intended light emission color of the second light emitting device 200 is less likely to leak, because the upper surface of the light emitting element 10 (i.e., the surface of the light transmissive substrate) is covered by the second light transmissive member 30.

The light emitting device of the present disclosure can be used for a variety of light sources, for example, lighting, various kinds of indicators, display, liquid crystal backlight lights, signaling devices, components installed in vehicles, and signage channel letters, as well as interior and exterior lighting for vehicles.

What is claimed is:

1. A light emitting device comprising:
   a light emitting element;
   a first light transmissive member containing a first phosphor, the first light transmissive member being in contact with an upper surface of the light emitting element, and having an area smaller than the light emitting element in a plan view;
   a second light transmissive member containing a second phosphor, the second light transmissive member covering lateral surfaces of the first light transmissive member and a part of the upper surface of the light emitting element that is exposed from the first light transmissive member, with an upper surface of the first light transmissive member being not covered by the second light transmissive member; and
   a light reflective member covering lateral surfaces of the second light transmissive member and lateral surfaces of the light emitting element.

2. The light emitting device according to claim 1, wherein
   a portion of each of the lateral surfaces at an upper surface side of the first light transmissive member is not covered by the second light transmissive member.

3. The light emitting device according to claim 1, wherein the light reflective member directly covers a portion of each of the lateral surfaces of the first light transmissive member that is not covered by the second light transmissive member.

4. The light emitting device according to claim 1, wherein the second light transmissive member includes at least one curved surface on a light reflective member side.

5. The light emitting device according to claim 4, wherein the at least one curved surface is concave to the light reflective member.

6. The light emitting device according to claim 1, wherein the second light transmissive member continuously covers the lateral surfaces of the first light transmissive member disposed on an outer side.

7. The light emitting device according to claim 1, wherein the first light transmissive member is a phosphor sintered body containing the first phosphor.

8. The light emitting device according to claim 1, wherein the second light transmissive member is a resin member containing the second phosphor.

9. The light emitting device according to claim 8, wherein the resin member is made of a silicone resin.

10. The light emitting device according to claim 1, wherein
    a density of particles of the second phosphor contained in the second light transmissive member becomes higher toward a light emitting element side.

11. The light emitting device according to claim 1, wherein
    the first phosphor and the second phosphor contain the same phosphor material.

12. The light emitting device according to claim 1, wherein
    the light emitting element includes a plurality of semiconductor layered bodies per a single light transmissive substrate.

13. The light emitting device according to claim 1, wherein
    the light emitting device emits white light.

* * * * *